(12) United States Patent
Yamada

(10) Patent No.: US 9,062,647 B2
(45) Date of Patent: Jun. 23, 2015

(54) SEMICONDUCTOR DEVICE INCLUDING CURRENT CONTROL FUNCTION AND SELF-INTERRUPT FUNCTION

(71) Applicant: FUJI ELECTRIC CO., LTD., Kawasaki-shi (JP)

(72) Inventor: Kazuhito Yamada, Hachioji (JP)

(73) Assignee: FUJI ELECTRIC CO., LTD. (JP)

( * ) Notice: Subject to any disclaimer, the term of this patent is extended or adjusted under 35 U.S.C. 154(b) by 254 days.

(21) Appl. No.: 13/862,783

(22) Filed: Apr. 15, 2013

(65) Prior Publication Data
US 2013/0279067 A1 Oct. 24, 2013

(30) Foreign Application Priority Data

Apr. 19, 2012 (JP) ................................ 2012-095767
Sep. 24, 2012 (JP) ................................ 2012-209948

(51) Int. Cl.
*H02H 3/08* (2006.01)
*H02H 9/02* (2006.01)
*F02P 3/00* (2006.01)
*F02P 3/04* (2006.01)
*H03K 17/082* (2006.01)
*F02P 3/055* (2006.01)
*H02H 3/20* (2006.01)
*H02H 9/04* (2006.01)
(Continued)

(52) U.S. Cl.
CPC ... *F02P 3/00* (2013.01); *F02P 3/04* (2013.01); *H03K 4/023* (2013.01); *H03K 17/0822* (2013.01); *H03K 2017/0806* (2013.01); *F02P 3/0554* (2013.01)

(58) Field of Classification Search
USPC ......................................................... 361/93.2
See application file for complete search history.

(56) References Cited

U.S. PATENT DOCUMENTS 6,684,867 B2 * 2/2004 Ito et al. ......................... 123/644
7,751,157 B2 * 7/2010 Migliavacca ................... 361/18
(Continued)

FOREIGN PATENT DOCUMENTS

JP   2002-004991 A   1/2002
JP   2006-037822 A   2/2006
(Continued)

OTHER PUBLICATIONS

European Search Report issued in European counterpart application No. EP13164025.2, dated Oct. 29, 2013.

*Primary Examiner* — Dharti Patel
(74) *Attorney, Agent, or Firm* — Rossi, Kimms & McDowell LLP

(57) ABSTRACT

In aspects of the invention, there is provided an igniting semiconductor device that can prevent burning of an IGBT or ignition coil, and erroneous ignition, even when reducing the size of a capacitor that generates a self-interrupting circuit time constant. In some aspects, a semiconductor device of the invention is configured of an IGBT and a current control circuit. The current control circuit can be configured of a first series circuit wherein an IGBT and a sense resistor are connected in series, a drive signal control circuit, and a self-interrupting circuit. At a time of abnormal operation, the self-interrupting circuit can output a voltage whose amplitude temporally drops in stages toward 0V to the drive signal control circuit. The drive signal control circuit can control the amplitude of a drive control signal so that the voltage across the sense resistor is equivalent to the output voltage of the self-interrupting circuit.

7 Claims, 18 Drawing Sheets

(51) Int. Cl.
*H03K 4/02* (2006.01)
*H03K 17/08* (2006.01)

(56) References Cited

U.S. PATENT DOCUMENTS

| | | | |
|---|---|---|---|
| 2001/0037801 A1* | 11/2001 | Ito et al. | 123/644 |
| 2004/0085104 A1 | 5/2004 | Sanchez | |
| 2006/0022609 A1 | 2/2006 | Yukutake et al. | |
| 2008/0136398 A1* | 6/2008 | Nakashimo | 323/299 |
| 2008/0191779 A1* | 8/2008 | Heppenstall | 327/427 |
| 2009/0262559 A1* | 10/2009 | Kaneko | 363/21.04 |
| 2012/0033341 A1* | 2/2012 | Miyazawa | 361/253 |

FOREIGN PATENT DOCUMENTS

| | | |
|---|---|---|
| JP | 2008-045514 A | 2/2008 |
| JP | 2012-036848 A | 2/2012 |

* cited by examiner

SEMICONDUCTOR DEVICE INCLUDING CURRENT CONTROL FUNCTION AND SELF-INTERRUPT FUNCTION

BACKGROUND OF THE INVENTION

1. Technical Field

Embodiments of the invention relate to semiconductor devices used in automobile internal combustion engine ignition devices, as well as other devices.

2. Related Art

FIG. 17 shows an example of a configuration of a heretofore known general internal combustion engine ignition semiconductor device using an insulated gate bipolar transistor (hereafter referred to as an IGBT) as a power semiconductor element. See, for example, Japanese Patent Application No. JP-A-2012-36848.

An ignition device shown in FIG. 17 is configured of an engine control unit (hereafter referred to as an ECU) 1, a semiconductor device 5, and an ignition unit 7.

The ignition device shown in FIG. 17 is such that, on an abnormal condition being detected, a self-interrupt signal Vsd is emitted from a self-interrupt signal source 10, a self-interrupting circuit 33 operates, and a collector current Ic of an IGBT Tr2 is interrupted. An abnormal condition is a condition such that there is a danger of damage such as burning occurring in an ignition coil L or the semiconductor device 5, such condition being, for example, a turn-on signal output from the ECU 1 being longer than a predetermined time (for example, 10 ms or longer), or the temperature of the semiconductor device 5 being higher than a specified value (for example, 180° C. or higher).

However, when the collector current Ic is abruptly interrupted using this kind of current control function or self-interrupt function, fluctuation is caused in the collector current Ic, and there is a problem in that erroneous ignition of a spark plug 4 is caused, and the engine is damaged.

Technology whereby the collector current Ic is gently reduced being known as a countermeasure to erroneous ignition caused by the fluctuation of the collector current Ic, a method whereby a soft shut-off circuit is provided, and a gentle reduction time set, is disclosed in Japanese Patent Application No. JP-A-2008-45514. Also, a method whereby an integrated circuit formed of a diode and capacitor is provided, and a collector current Ic gentle reduction time set, is disclosed in Japanese Patent Application No. JP-A-2006-37822.

Meanwhile, a current control circuit 6 shown in FIG. 17 includes a self-interrupting circuit 33 shown in FIG. 18. The self-interrupting circuit 33 is configured of a bias circuit wherein a DepMOSFET (Depression Metal-Oxide Semiconductor Field-Effect Transistor, hereafter referred to as a DepMOS) Tr7 and a MOSFET (Metal-Oxide Semiconductor Field-Effect Transistor, hereafter referred to as a MOS) Tr8 are connected in series with a common gate, a MOS Tr9 configuring a current mirror circuit with the MOS Tr8, a MOS Tr4 connected in series with the MOS Tr9, an inverter NOT1 connected to the gate of the MOS Tr4, and a capacitor C1 connected in parallel to the MOS Tr9.

The MOS Tr4 is controlled on and off by the self-interrupt signal Vsd, being in an on-state at a time of no al operation and an off-state at a time of abnormal operation. Also, by the on-state resistance of the MOS Tr4 being set sufficiently low in comparison with the on-state resistance of the MOS Tr9, the capacitor C1 is charged at a time of normal operation, and a reference voltage Vref is output as it is, while at a time of abnormal operation, the output voltage gradually drops from Vref to 0V by the capacitor C1 being discharged via the MOS Tr9.

An operational amplifier OP1 detects the difference between a voltage (hereafter referred to as a sense voltage) Vsns across a sense resistor R1 and the reference voltage Vref, wherein a target value of the collector current (the current caused to flow through a primary coil L1) Ic is converted into voltage, the two voltages having been level shifted via level shift circuits 9 and 15 respectively. The on-state resistance of the MOS Tr3 is controlled by the gate voltage of the MOS Tr3 being controlled in accordance with the result of the detection.

The ignition semiconductor device shown in FIG. 17 is such that, in order to reduce the capacitance C1 without changing a temporal amount of change (hereafter called the inclination) dIc/dt in the collector current, it is sufficient to reduce a drain current Id of the MOS Tr9. However, as the drain current Id is an extremely low current in the order of nA, the more the drain current Id is reduced, the more difficult it becomes to maintain a constant current. Consequently, reducing the drain current Id is not desirable. Also, as erroneous ignition occurs when the inclination dIc/dt of the collector current is too large, while the IGBT or ignition coil L is burned when the inclination dIc/dt is too small, there is a demand for a high precision drain current Id control.

Thus, as described in the related art, there is a limit to the reduction of capacitance of the self-interrupting circuit capacitor and the accuracy of current control, as well as other shortcomings.

SUMMARY OF THE INVENTION

Embodiments of the invention address these and other shortcomings. Some embodiments of the invention provide a semiconductor device that can reliably prevent burning of an IGBT ignition coil, and erroneous ignition, even when reducing the capacitance of a self-interrupting circuit capacitor.

A semiconductor device according to one aspect of the invention includes a first series circuit wherein a first semiconductor switching element and a sense resistor are connected in series, a second semiconductor switching element connected in parallel to the first series circuit, a drive signal control circuit, into which a drive signal is input, that outputs a drive control signal controlling the first and second semiconductor switching elements, and a self-interrupting circuit connected to the drive signal control circuit, wherein the self-interrupting circuit outputs a predetermined voltage to the drive signal control circuit at a time of normal operation, and outputs a voltage whose amplitude temporally changes in stages to the drive signal control circuit at a time of abnormal operation, and the drive signal control circuit controls so that the amplitude of the drive control signal decreases when the voltage across the sense resistor is higher than the output voltage of the self-interrupting circuit, and controls so that the amplitude of the drive control signal increases when the voltage across the sense resistor is lower than the output voltage of the self-interrupting circuit.

In some embodiments, it is possible to temporally change in stages the current amplitude of the second semiconductor switching element by comparing the voltage whose amplitude temporally changes in stages at a time of abnormal operation and the voltage across the sense resistor proportional to the current of the second semiconductor switching element, and controlling the amplitude of the drive control signal. Consequently, as it is possible to change the current of the second semiconductor switching element gently, unlike with an on/off control, it is possible to prevent erroneous ignition.

The semiconductor device according to the aspect of the invention can include a self-interrupting circuit includes a second series circuit wherein a third semiconductor switching element and a first capacitor are connected in series, a fourth semiconductor switching element connected in parallel to the first capacitor, and a third series circuit wherein a fifth semiconductor switching element and a second capacitor are connected in series, wherein the second series circuit is connected in parallel to the second capacitor, which outputs the voltage across the second series circuit to the drive signal control circuit, and a voltage of a predetermined value is applied to the third series circuit, and the self-interrupting circuit further includes an abnormality detecting circuit that supplies the voltage of the predetermined value to the second capacitor by the fifth semiconductor switching element being turned on when it is determined that there is normal operation, and interrupts the voltage supplied to the second capacitor by the fifth semiconductor switching element being turned off when it is determined that there is abnormal operation, and an interval generator circuit that exclusively turns the third and fourth semiconductor switching elements on and off at a predetermined interval.

According to some embodiments, it is possible to delay the discharge of the second capacitor by lengthening the change cycle of the voltage whose amplitude temporally changes in stages, and thus possible to reduce the capacitance of the second capacitor.

Also, in some embodiments, it is possible to prevent burning of the IGBT or ignition coil, and erroneous ignition, by regulating the capacitance of the second capacitor and the predetermined interval.

In some embodiments, a self-interrupting circuit is such that an nA order constant current source is unnecessary, and it is thus possible to reliably prevent burning of the IGBT or ignition coil, and erroneous ignition.

The semiconductor device according to the aspect of the invention is such that the abnormality detecting circuit determines that there is abnormal operation when the drive signal is input into the drive signal control circuit for a time exceeding a predetermined time.

According to some embodiments of the invention, when the drive signal is input into the drive signal control circuit for a time exceeding a predetermined time, the self-interrupting circuit temporally changes the amplitude of the drive control signal in stages, thereby reducing the current of the second semiconductor switching element gently. That is, it is possible to prevent a second semiconductor switching element overcurrent that continues to increase as long as the second semiconductor switching element continues to be in an on-state, and thus possible to prevent burning.

The semiconductor device according to the aspect of the invention is such that the abnormality detecting circuit determines that there is abnormal operation when the temperature of a predetermined region exceeds a predetermined temperature.

According to some embodiments, the self-interrupting circuit temporally changes the amplitude of the drive control signal in stages when the temperature of the predetermined region exceeds a predetermined temperature, thereby reducing the current of the second semiconductor switching element gently. That is, it is possible to prevent overheating of the predetermined region, and thus possible to prevent accidents including burning.

The semiconductor device according to the aspect of the invention is such that the interval generator circuit controls at least one of the turn-on timing or duty of the third semiconductor switching element.

According to some embodiments, it is possible to control at least one of the voltage range or duration of one stage of the voltage whose amplitude is temporally changed in stages, and thus possible to control the current of the second semiconductor switching element as desired. For example, by lengthening the turn-on timing cycle, it is possible to lengthen the duration of one stage of the voltage whose amplitude is temporally changed in stages. Also, by reducing the duty, it is possible to reduce the voltage range of one stage of the voltage whose amplitude is temporally changed in stages. That is, it is possible to reliably prevent burning of the IGBT or ignition coil, and erroneous ignition, even when reducing the capacitance of the self-interrupting circuit capacitor.

The semiconductor device according to the aspect of the invention is such that the interval generator circuit lengthens the turn-on timing cycle of the third semiconductor switching element further the higher the temperature of a predetermined region.

According to some embodiments, it is possible to reduce variation in the amount of change in one stage of the voltage whose amplitude is temporally changed in stages caused by temperature change in a predetermined region. That is, it is possible to control the current of the second semiconductor switching element so that dependency on the temperature of a predetermined region is reduced.

The semiconductor device according to the aspect of the invention is such that the interval generator circuit reduces the duty of the third semiconductor switching element further the higher the voltage of the second capacitor.

According to some embodiments, the amount of change in one stage of the voltage whose amplitude is temporally changed in stages is such that the duration of the sudden voltage drop when the voltage across the self-interrupting circuit capacitor is high can be reduced, and the voltage range narrowed. That is, as it is possible to obtain a still gentler change in the current of the second semiconductor switching element, it is possible to more reliably prevent erroneous ignition.

According to the semiconductor device of the invention, an excellent advantage may be obtained in that it is possible to reliably prevent burning of an IGBT or ignition coil, and erroneous ignition, even when reducing the capacitance of a capacitor generating a self-interrupting circuit time constant.

DETAILED DESCRIPTION

Hereafter, referring to the attached drawings, a description will be given of embodiments of the invention.

First Embodiment

Figure 1:
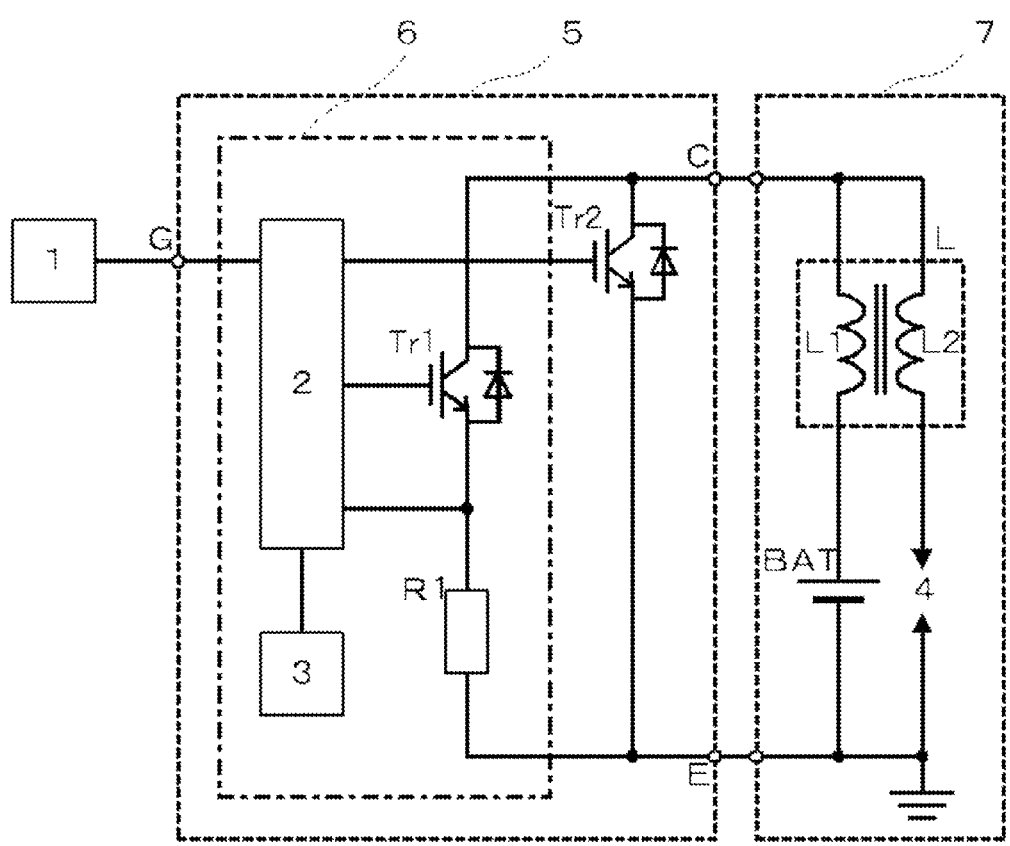
FIG. 1 is a diagram showing a configuration of a semiconductor device in accordance with some embodiments of the invention.
Figure 2:
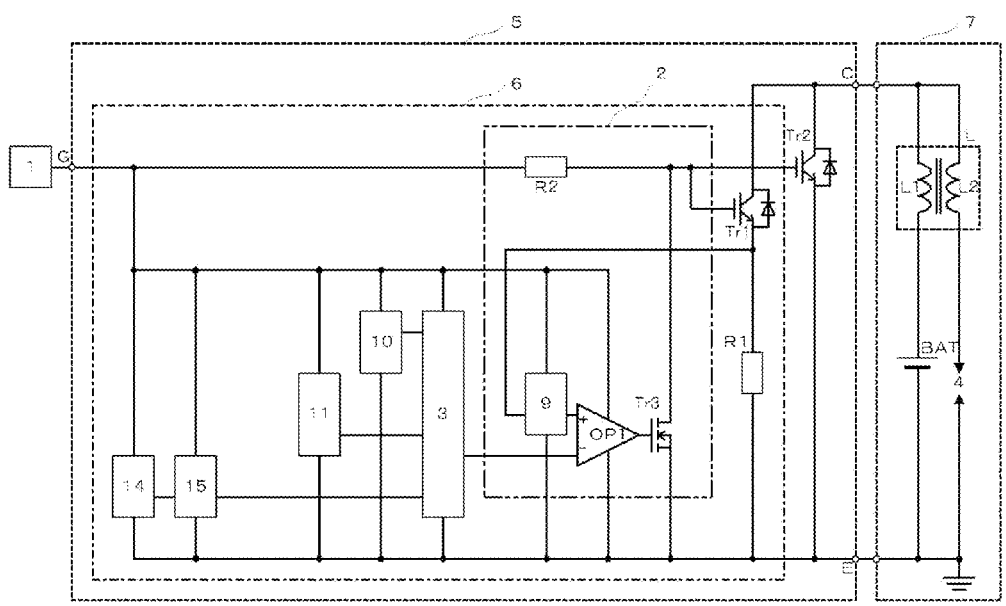
FIG. 2 is a diagram showing a semiconductor device according to a first embodiment of the invention.
Figure 17:
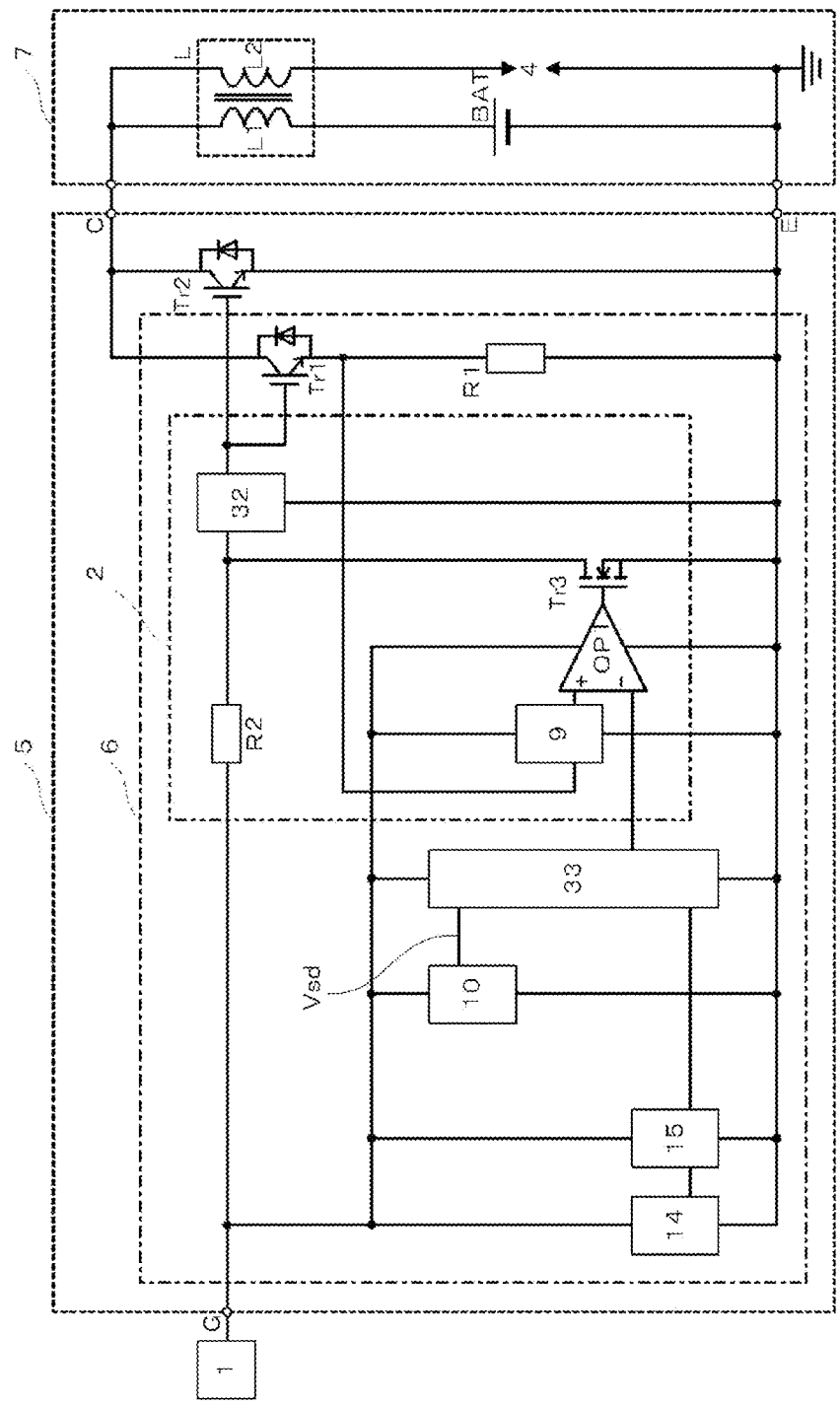
FIG. 17 is a diagram showing a configuration of a heretofore known semiconductor device.

FIG. 2 shows a semiconductor device according to a first embodiment of the invention, wherein portions given the same reference signs as in FIG. 17 represent the same portions, and the basic configuration is the same as the heretofore known configuration shown in FIG. 17.

Next, a description will be given of a circuit configuration of the first embodiment.

The circuit of the first embodiment of the invention is configured of an ECU 1, a semiconductor device 5, and an ignition unit 7. The semiconductor device 5 has a G terminal, a C terminal, and an E terminal, wherein the G terminal is connected to the ECU 1, and the C and E terminals are connected to the ignition unit 7.

The semiconductor device 5 is configured of an IGBT Tr2 and a current control circuit 6. The current control circuit 6 is configured of a first series circuit wherein an IGBT Tr1 and a sense resistor R1 are connected in series, a reference voltage supply 14, a level shift circuit 15, a drive signal control circuit 2, a self-interrupt signal source 10, and a self-interrupting circuit 3. The first series circuit is connected in parallel to the IGBT Tr2, a connection point of the IGBTs Tr1 and Tr2 is connected to the C terminal, and a connection point of the sense resistor R1 and IGBT Tr2 is connected to the E terminal.

The drive signal control circuit 2 is configured of a second series circuit, wherein one end of a gate resistor R2 and one end of a MOS Tr3 are connected in series, and an operational amplifier OP1. The other end of the gate resistor R2 is connected to the G terminal, while the other end of the MOS Tr3 is connected to the E terminal. An intermediate point of the second series circuit is connected to control terminals of the IGBTs Tr1 and Tr2 as an output of the drive signal control circuit 2. Also, the intermediate point of the second series circuit may also be connected to the control terminals of the IGBTs Tr1 and Tr2 via a gate control circuit 8. The output terminal of the operational amplifier OP1 is connected to a control terminal of the MOS Tr3. The positive side input terminal of the operational amplifier OP1 is connected via the level shift circuit 15 to an intermediate point of the first series circuit. The negative side input terminal of the operational amplifier OP1 is connected to the self-interrupting circuit 3.

The ignition unit 7 is configured of an ignition coil L having primary and secondary coils L1 and L2, a fourth series circuit wherein the primary coil L1 and a battery BAT are connected in series, and a fifth series circuit wherein the secondary coil L2 and a spark plug 4 are connected in series. The fourth and fifth series circuits are connected in parallel to the second IGBT Tr2.

Figure 3:
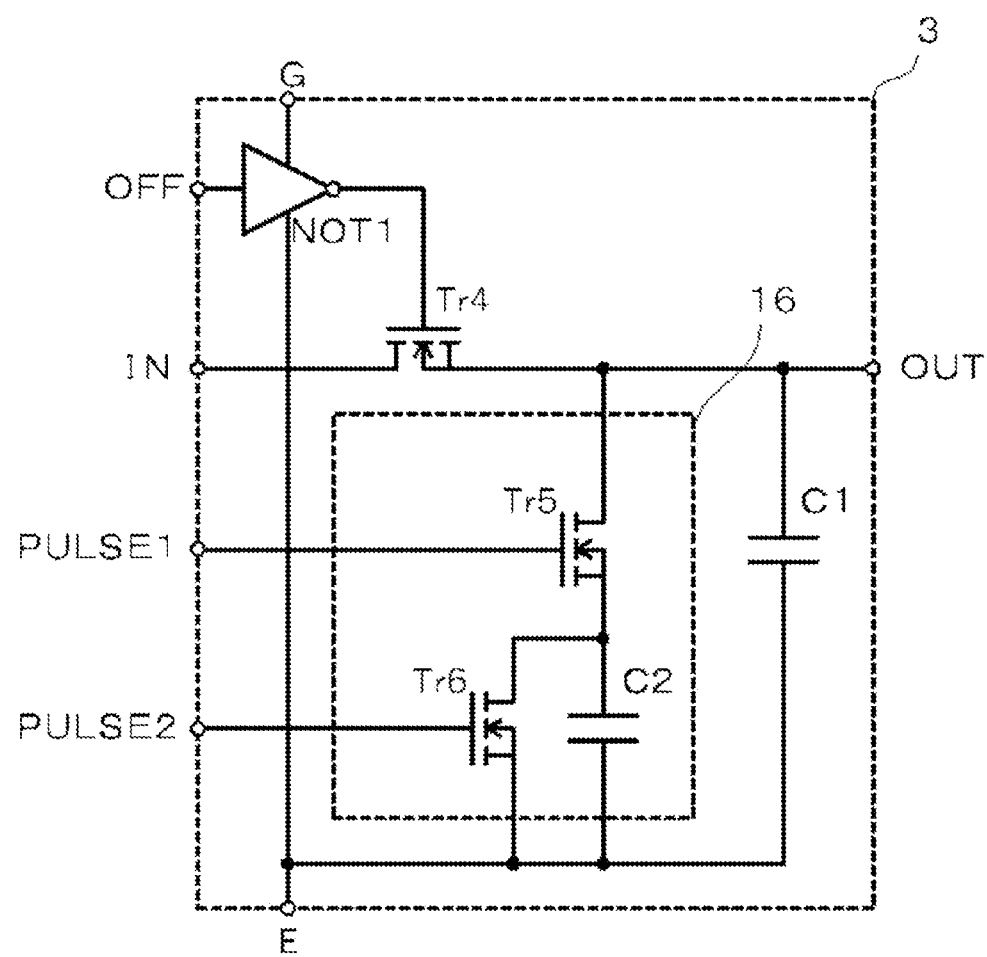
FIG. 3 is a diagram showing an example of a circuit configuration of a self-interrupting circuit in accordance with some embodiments of the invention.
Figure 18:
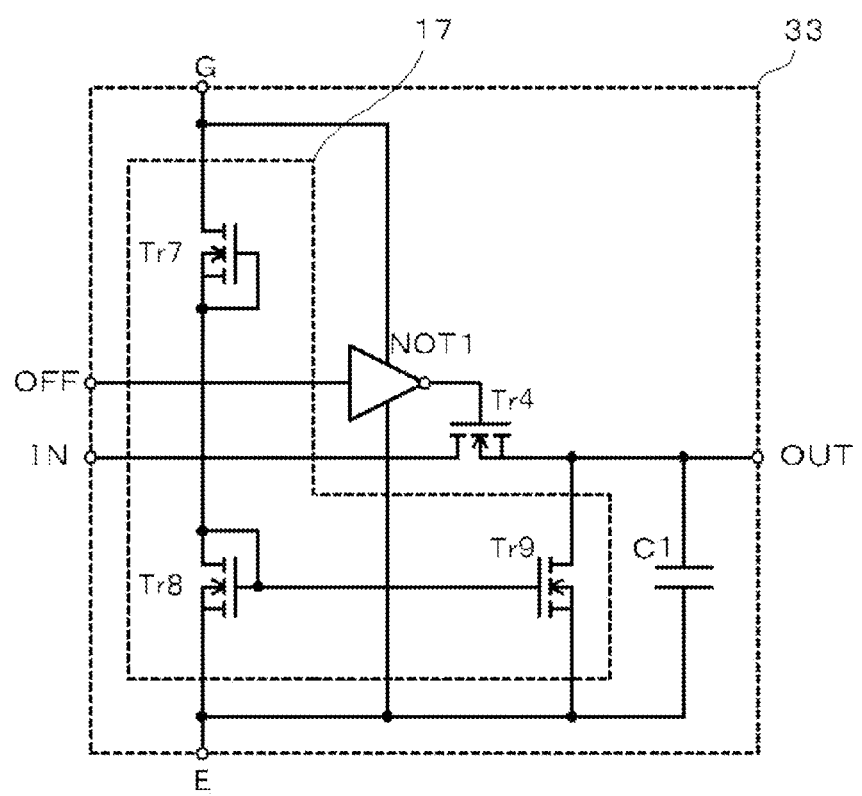
FIG. 18 is a diagram showing an example of a circuit configuration of a heretofore known self-interrupting circuit.

FIG. 3 shows the self-interrupting circuit 3 of the invention. The self-interrupting circuit 3 of the invention differs from a heretofore known self-interrupting circuit 33 shown in FIG. 18 in that a power supply circuit 17 is replaced with a switched capacitor circuit 16.

The self-interrupting circuit 3 is configured of a second series circuit, wherein one end of a MOS Tr4 and a capacitor C1 are connected in series, and the switched capacitor circuit 16. The switched capacitor circuit 16 is configured of a third series circuit, wherein a MOS Tr5 and a capacitor C2 are connected in series, and a MOS Tr6 connected in parallel to the capacitor C2. The third series circuit is connected in parallel to the capacitor C1. The other end of the MOS Tr4 is connected via the level shift circuit 15 to the output terminal of the reference voltage supply 14, while the control terminal of the MOS Tr4 is connected to the output terminal of the self-interrupt signal source 10.

Next, a description will be given of an operation of the semiconductor device according to the first embodiment.

Firstly, a drive signal is output from the ECU 1, and the IGBTs Tr1 and Tr2 are turned on via the drive signal control circuit 2. At this time, the on-state resistance of the IGBTs Tr1 and Tr2 is determined by the gate resistor R2 of the drive signal control circuit 2. The drive signal from the ECU 1 also acts at the same time as a power source of the reference voltage supply 14, level shift circuit 15, self-interrupting circuit 3, and operational amplifier OP1.

At this time, the reference voltage supply 14 generates a reference voltage Vref wherein a target value of a current (a collector current Ic) caused to flow through the primary coil L1 has been converted into a voltage. The reference voltage Vref is stepped-up by the level shift circuit 15 to a voltage of a level that can operate the operational amplifier OP1. The stepped-up reference voltage Vref is applied to the second series circuit of the self-interrupting circuit 3.

Also, a current proportional to the current flowing through the primary coil L1 flows through the sense resistor R2, and a sense voltage Vsns, which is the voltage across the sense resistor 2, is stepped-up by the level shift circuit 15 to a voltage of a level that can operate the operational amplifier OP1. The stepped-up sense voltage Vsns is input into the positive side terminal of the operational amplifier OP1.

Herein, at a time of normal operation, the MOS Tr4 is turned on by the signal from the self-interrupt signal source 10, and the reference voltage Vref is applied directly to the negative terminal of the operational amplifier OP1. Together with this, the capacitor C1 is charged by the reference voltage Vref.

Figure 4:
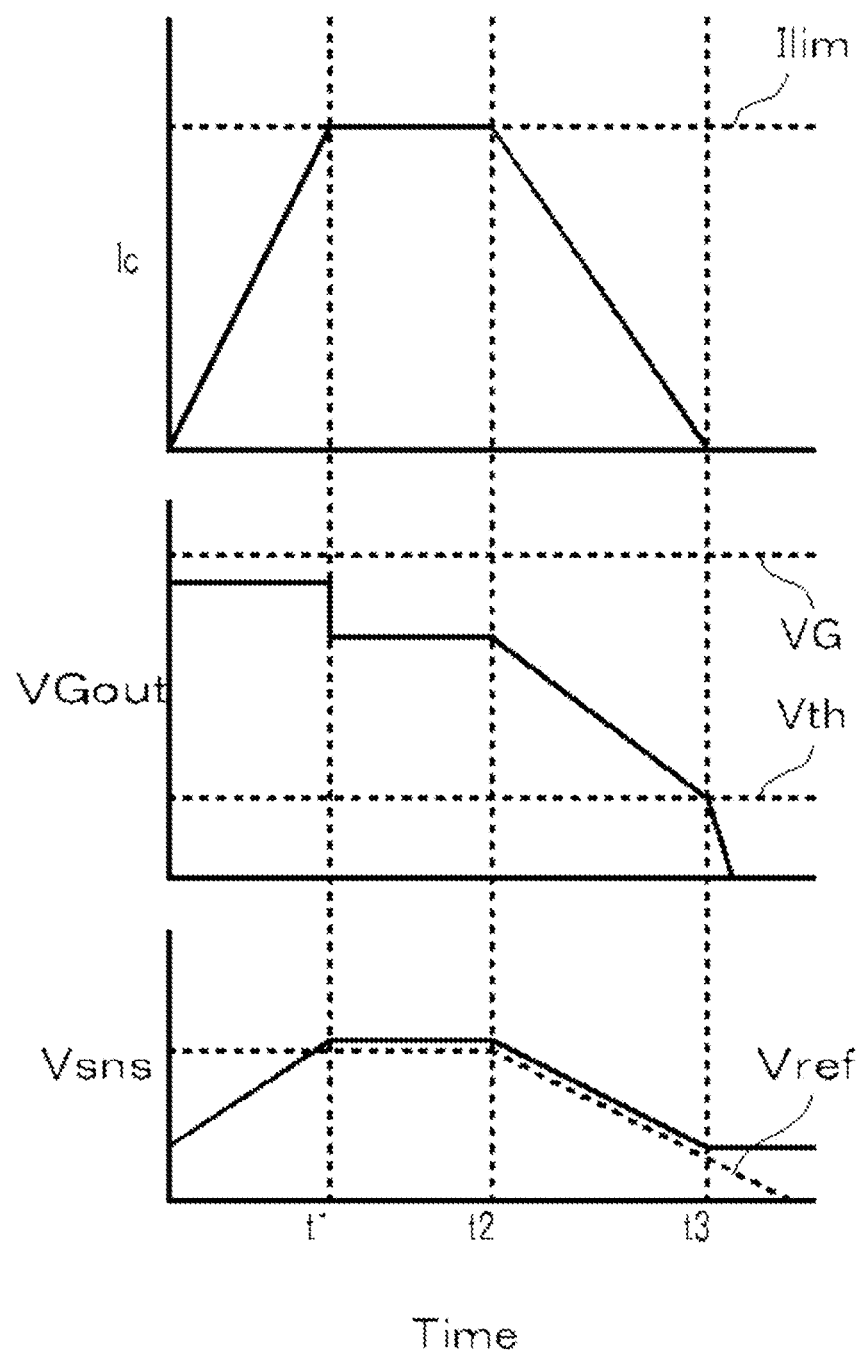
FIG. 4 is a diagram showing operation waveforms of the semiconductor device according to the first embodiment of the invention.

FIG. 4 shows operation waveforms of the semiconductor device 5 of the invention. In FIG. 4, the collector current of the IGBT Tr2 is taken to be IC, the rated current of the IGBT Tr2 is Ilim, the gate voltage of the IGBT Tr2 is VGout, the voltage of the G terminal of the semiconductor device 5 is VG, the threshold value voltage of the IGBT Tr2 is Vth, the sense voltage is Vsns, and the reference voltage is Vref.

When Vref<Vsns, the output voltage of the operational amplifier OP1 rises, and the on-state resistance of the MOS Tr3 decreases. Also, when VrefVsns, the output voltage of the operational amplifier OP1 drops, and the on-state resistance of the MOS Tr3 increases. By the amplitude of the IGBT Tr2 gate voltage VGout being controlled in this way, the collector current Ic is controlled to a predetermined current value (t1).

Meanwhile, at a time of abnormal operation, the MOS Tr4 is turned off by a self-interrupt signal Vsd generated by the self-interrupt signal source 10 (t2), and the reference voltage Vref is interrupted. At this time, the capacitor C1 is discharged by an operation of the switched capacitor circuit 16, to be described hereafter, and the voltage applied to the negative terminal of the operational amplifier OP1 drops in stages from the reference voltage Vref to 0V. Together with this, the sense voltage Vsns caused to track the reference voltage Vref also drops, and the current of the primary coil L1 gradually decreases to 0 A. Then, when VGout becomes equal to Vth (the threshold value voltage of the IGBT Tr2), the collector current Ic is completely interrupted (t3).

Figure 5:
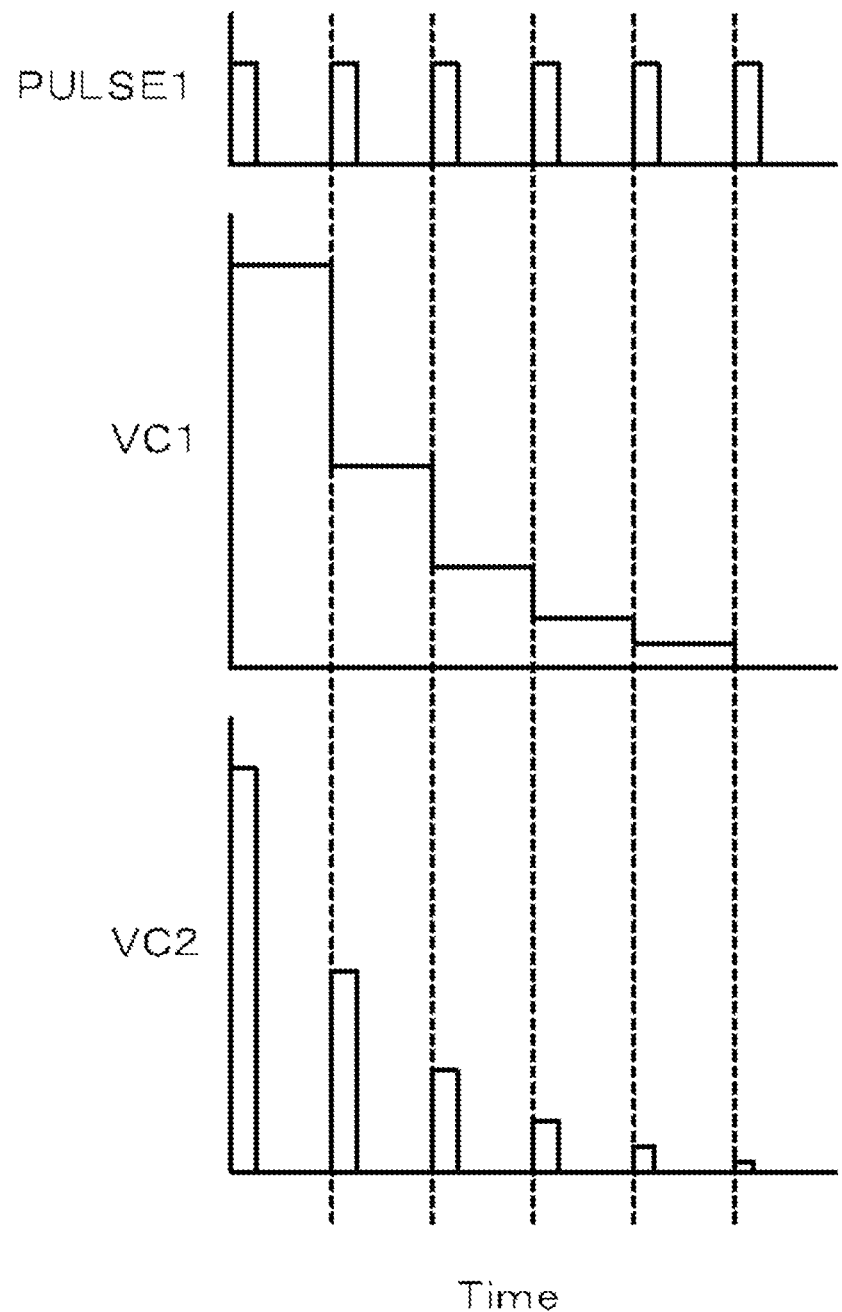
FIG. 5 is a diagram showing operation waveforms of a switched capacitor circuit according to the first embodiment of the invention.

FIG. 5 shows operation waveforms of the switched capacitor circuit 16. In FIG. 5, the voltage of the capacitor C1 is taken to be VC1, and the voltage of the capacitor C2 is VC2. As previously described, the switched capacitor circuit 16 is such that the third series circuit is connected in parallel to the capacitor C1. Further, a cyclical and exclusive on/off signal is input into the control terminals of the MOSs Tr5 and Tr6. Firstly, during a period for which the MOS Tr5 is in an on-state and the MOS Tr6 is in an off-state, the capacitor C1 is discharged via the third series circuit, and the capacitor C2 is charged. Next, during a period for which the MOS Tr5 is in an off-state and the MOS Tr6 is in an on-state, the capacitor C2 is discharged via the MOS Tr6.

As the charging and discharging of the capacitors C1 and C2 is repeated every time the on and off-states of the MOSs Tr5 and Tr6 are repeated in this way, the voltage of the capacitor C1 drops in stages, eventually reaching 0V. Herein, the capacitor voltage VC2, being the output voltage of the self-interrupting circuit 3, is the voltage in FIG. 4 of Vref from t2 onward shown schematically.

By controlling at least one of the cycle or duty of the signals turning the MOSs Tr5 and Tr6 on and off, it is possible to control the discharge speed of the capacitor C1. Also, as it is sufficient that the self-interrupting circuit 3 can generate a voltage that drops in stages at a time of abnormal operation, the configuration and method thereof are not limited to the switched capacitor circuit 16 of the invention.

As the reference voltage supply 14 and level shift circuit 15 are heretofore known technology, a detailed description of the operations thereof will be omitted. Also, an unshown gate control circuit 32 of heretofore known JP-A-2012-36848 may be connected to the intermediate point of the second series circuit, but a detailed description Will be omitted.

As the semiconductor device according to the first embodiment of he invention is such that an interruption time from t2 to t3 is proportional to capacitor C1/(capacitor C2×duty), it is possible, by designing each one as appropriate, to reduce the capacitor capacitance without changing the inclination dlc/dt of the collector current. For example, when the duty is 6.25%, the gently decreasing speed dl/dt does not change when the capacitor C1 is one-sixteenth of that heretofore known, and the capacitor C2 is four times the capacilor C1. That is, the capacitor capacitance can be reduced to four-sixteenths, that is, one-fourth, of that heretofore known.

Second Embodiment

Figure 6:
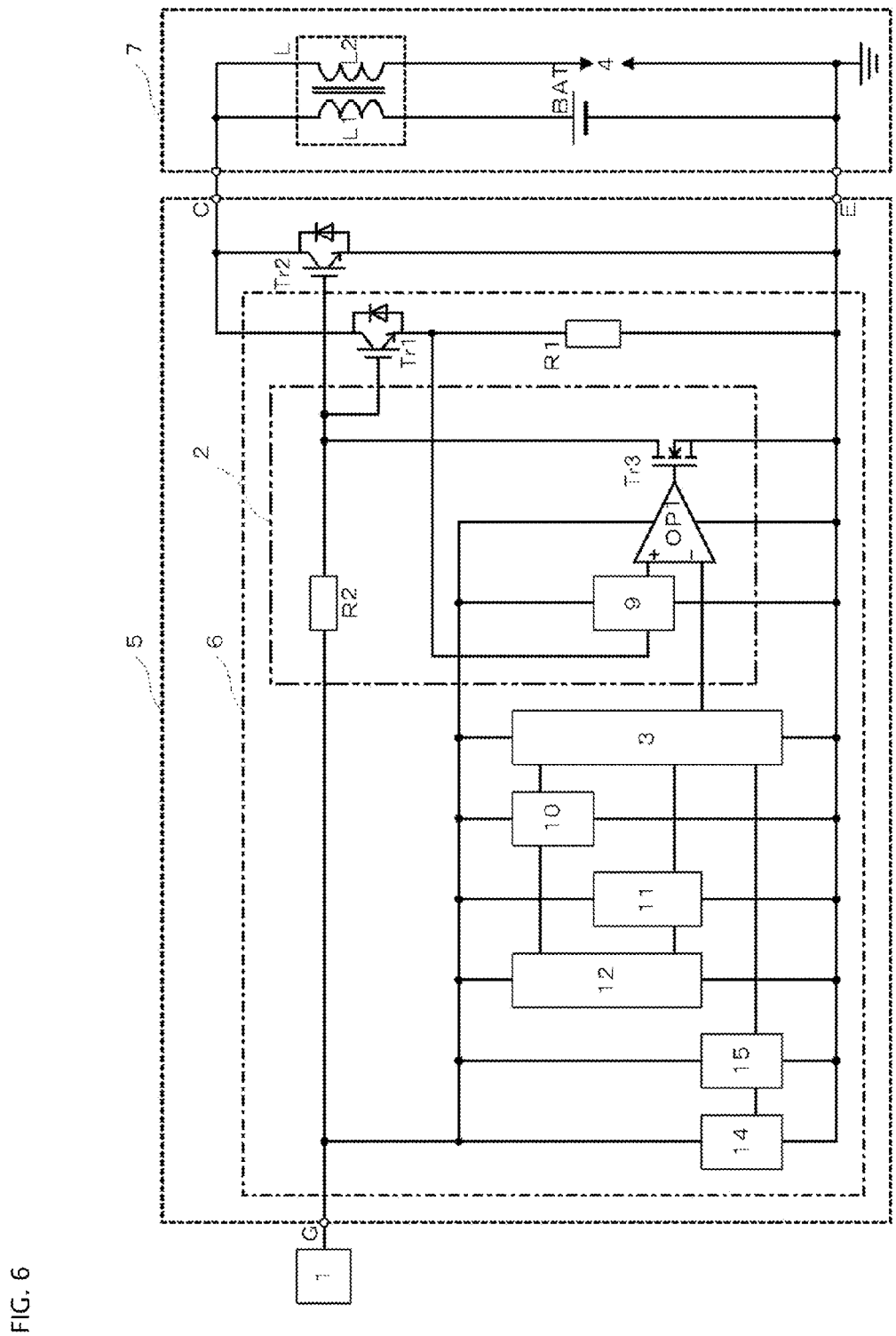
FIG. 6 is a diagram showing a semiconductor device according to a second embodiment of the invention.

FIG. 6 shows a semiconductor device according to a second embodiment of the invention, wherein the basic configuration is the same as that of the first embodiment shown in FIG. 2. The circuit of the second embodiment of the invention has a timer circuit 12 and a pulse generator circuit 11 in addition to the circuit configuration of the first embodiment.

Figure 7:
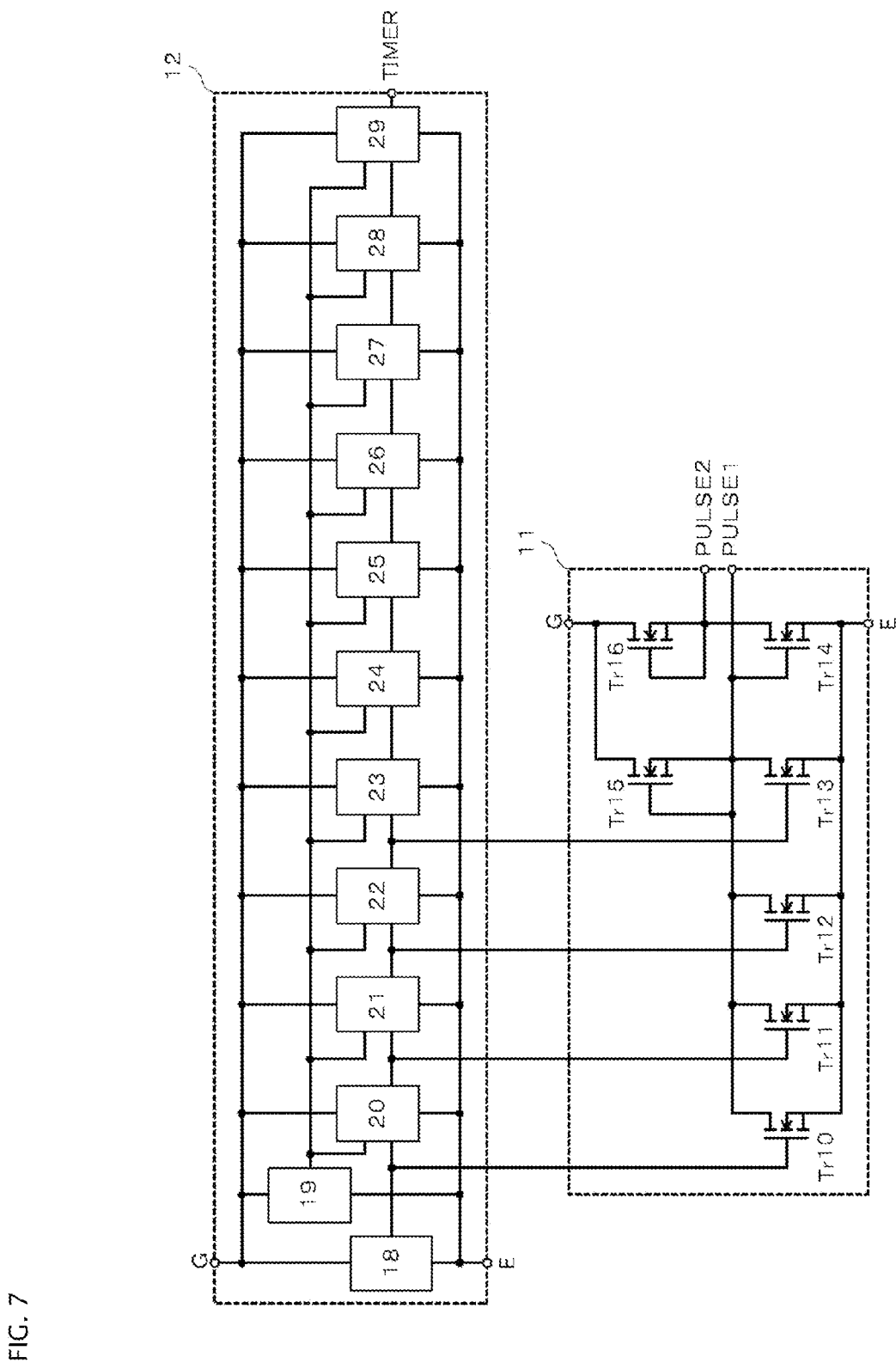
FIG. 7 is a diagram showing circuit configuration examples for a timer circuit and pulse generator circuit in accordance with some embodiments of the invention.

FIG. 7 shows circuit configuration examples for the timer circuit 12 and pulse generator circuit 11. The timer circuit 12 is configured of an oscillator 18, a reset circuit 19, and TFFs 20 to 29. The TFFs 20 to 29 are connected in a ten stage series, wherein the output of the previous stage is connected to the input of the next stage.

The pulse generator circuit 11 has MOSs Tr10 to Tr13 connected to each other in parallel. The pulse generator circuit 11 also has a sixth series circuit, wherein the source of a DepMOS Tr15 and the drain of the MOS Tr13 are connected, the MOS Tr14 are connected. Also, the sixth series circuit and seventh series circuit are connected in parallel, configuring a logical NOT circuit. The gate terminals of the MOSs Tr10 to Tr13 are connected to the oscillator 18 and the outputs of the TFFs 20 to 22.

Next, an outline description will be given of an operation of the semiconductor device according to the second embodiment.

The timer circuit 12 and pulse generator circuit 11 are driven by the voltage between the G terminal and E terminal, and generate a pulse voltage for exclusively turning the MOSs Tr5 and Tr6 of the switched capacitor circuit 16 on and off at a predetermined interval. Intermediate points of the sixth and seventh series circuits form an input and output of the logical NOT circuit, and are input into the MOSs Tr5 and Tr6 respectively.

Continuing, a detailed description will be given of operations of the timer circuit 12 and pulse generator circuit 11.

The timer circuit 12 is such that the oscillator 18 starts oscillating (for example, a cycle of 19.6 μs and a duty of 50%) on a turn-on signal being input into the G terminal. At the same time, the reset circuit 19 outputs a reset signal for a certain time (for example, 10 μs), resetting the TFFs 20 to 29, and turning off the output. After the reset signal has stopped, the TFFs output a signal of a cycle twice that of the input signal. Therefore, a TIMER signal, which is the final stage of the TFFs 20 to 29, has a cycle 1,024 times that of the oscillator 18.

Figure 8:
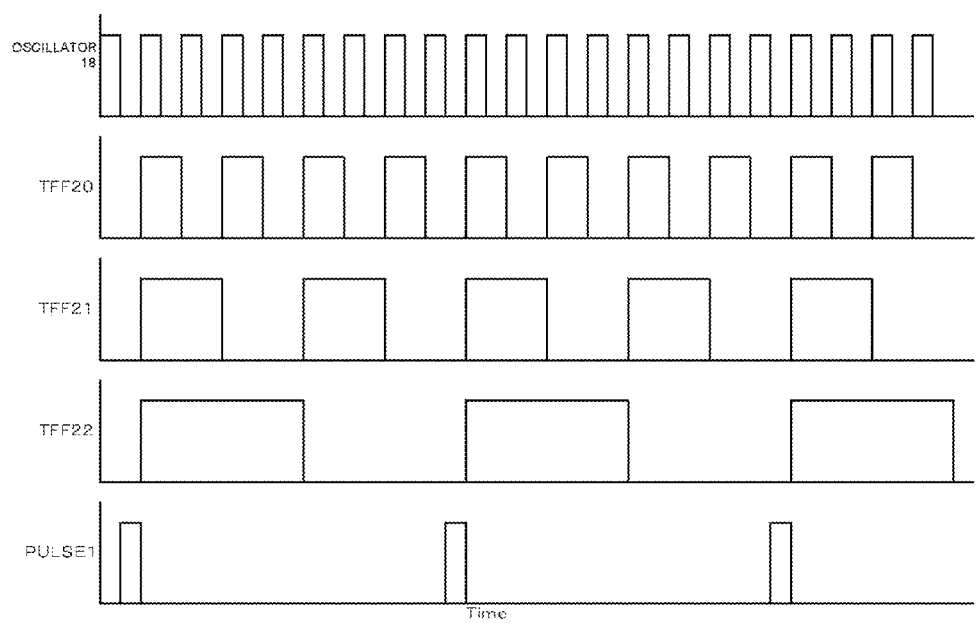
FIG. 8 is a diagram showing time charts for the timer circuit and pulse generator circuit according to the invention.

The output signals of the oscillator 18 and TFFs 20 to 22 are input into the gates of the MOSs Tr10 to Tr13, and a pulse signal PULSE1 turns on the MOS Tr5 only when all of the signals are in an off-state. Time charts of the output signals of the oscillator 18 and TFFs 20 to 22, and of the pulse signal PULSE1, are shown in FIG. 8. For example, when the signal of the oscillator 18 has a cycle of 9.8 μs and a duty of 50%, the pulse signal PULSE1 has a cycle of 78.4μs and a duty of 6.25%.

The semiconductor device according to the second embodiment the invention is such that it is possible to determine the cycles of the pulse signals PULSE1 and PULSE2 as desired by setting the frequency of the oscillator 18. Also, by selecting the connection positions of the gates of the MOSs Tr10 to Tr13 of the pulse generator circuit 11 and the number of MOSs, it is possible to determine the cycles and duties of the pulse signals PULSE1 and PULSE2 as desired.

Third Embodiment

Figure 9:
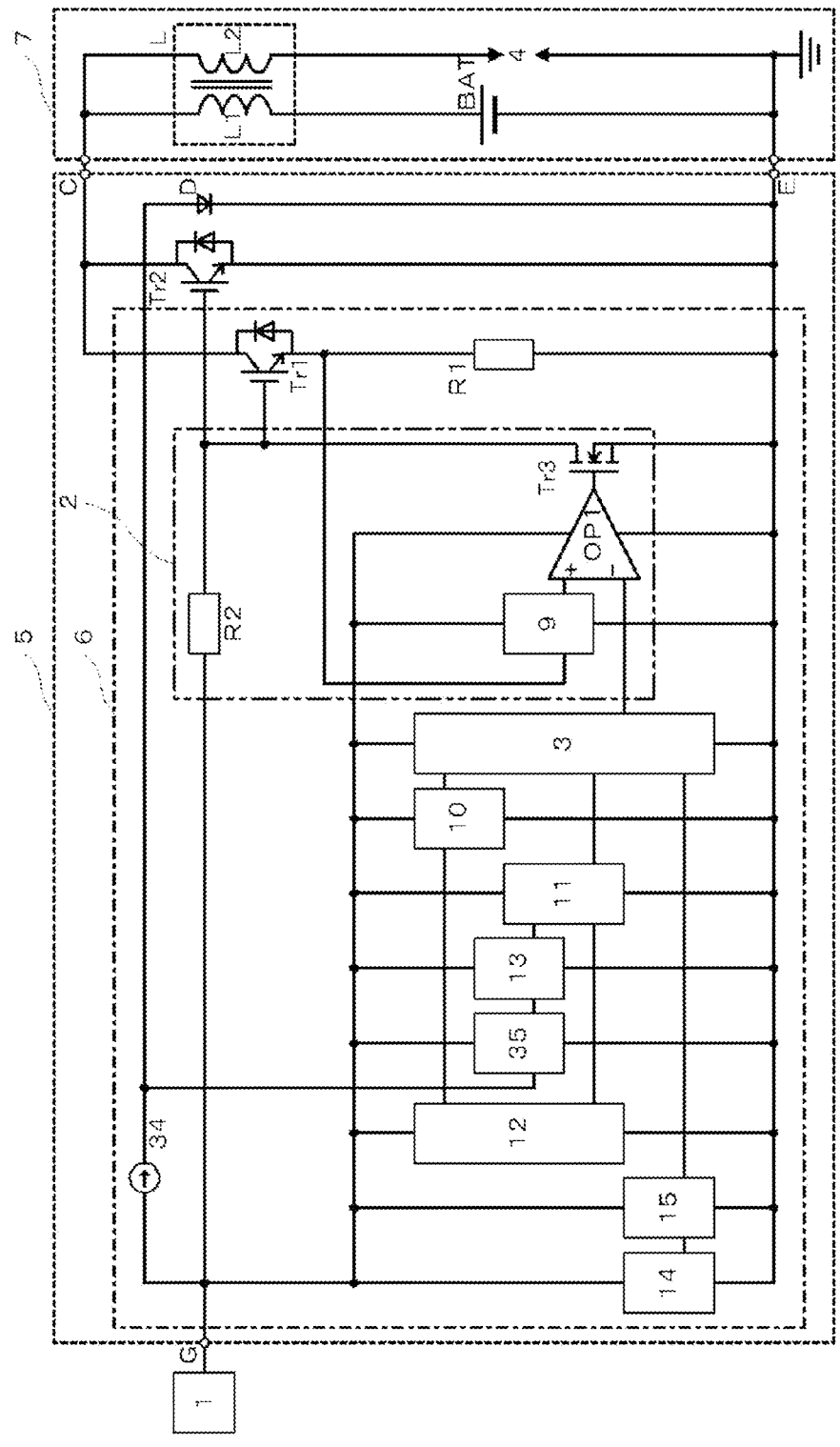
FIG. 9 is a diagram showing a semiconductor device according to a third embodiment of the invention.

FIG. 9 shows a semiconductor device according to a third embodiment of the invention, wherein the basic configuration is the same as that of the second embodiment shown in FIG. 6. The circuit of the third embodiment of the invention has a temperature compensation circuit 13, a constant current source 34, a level shift circuit 35, and a diode D. in addition to the circuit configuration of the second embodiment.

Figure 10:
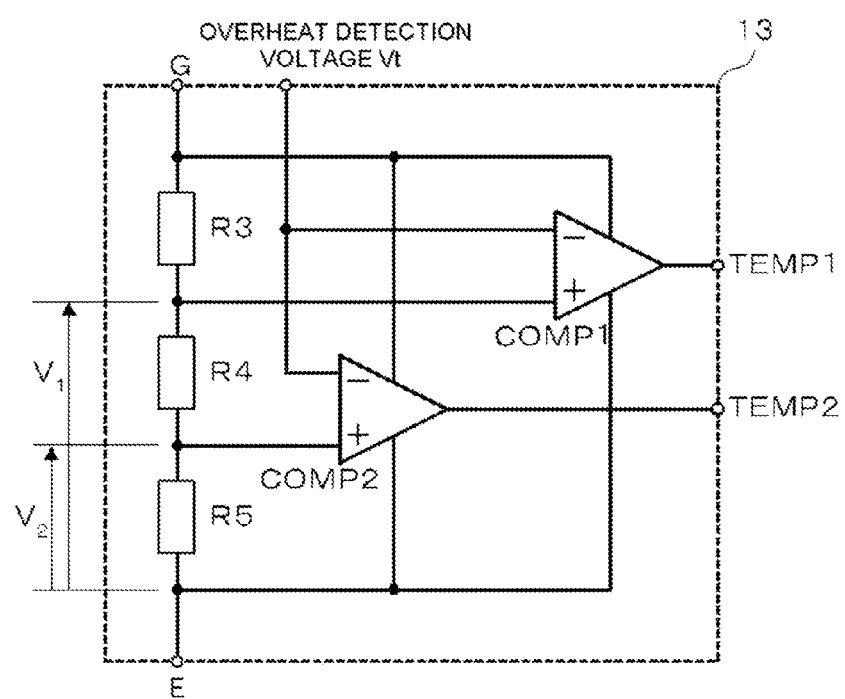
FIG. 10 is a diagram showing a circuit configuration example for a temperature compensation circuit in accordance with some embodiments of the invention.

FIG. 10 shows a circuit configuration example for the temperature compensation circuit 13. The temperature compensation circuit 13 has voltage dividing resistors R3 to R5 connected in series between the G terminal and E terminal, and comparators COMP1 and COMP2. An overheat detection voltage is input into the negative side terminals of the comparators COMP1 and COMP2, while voltages V1 and V2, wherein the voltage between the G terminal and E terminal is divided by the voltage dividing resistors R3 to R5, is input into the positive side terminals. Herein, the forward voltage of the diode D, which decreases in proportion to the temperature, is used as the overheat detection voltage. The divided voltage V1 is the voltage across a series circuit of the voltage dividing resistors R4 and R5, while the divided voltage V2 is the voltage across the voltage dividing resistor R5. In this way, the comparators COMP1 and COMP2 compare the overheat detection voltage and the divided voltages V1 and V2, and output the comparison results as TEMP1 and TEMP2.

Figure 11:
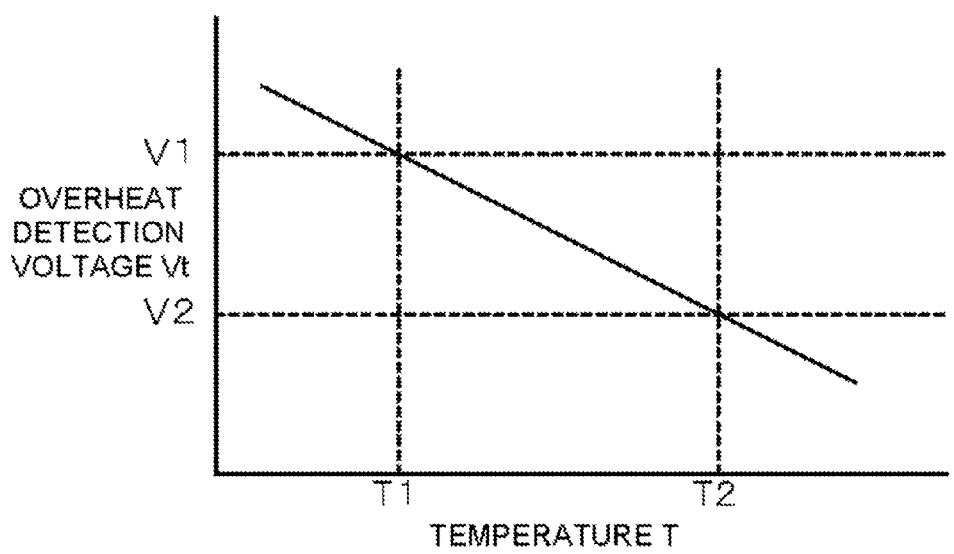
FIG. 11 is a diagram showing temperature characteristics of an overheat detection voltage in accordance with some embodiments of the invention.

FIG. 11 shows a case wherein, as temperature characteristics of an overheat detection voltage Vt, the overheat detection voltage Vt is equivalent to the divided voltages V1 and V2 when the temperature of a predetermined region is T1 and T2, and illustrates the temperature compensation signals TEMP1 and TEMP2. As V1<Vt and V2<Vt when a temperature T of the temperature detection region is such that T–T1, the temperature compensation signals TEMP1 and TEMP2 are output as L level signals. As V2<Vt<V1 when the temperature T of the temperature detection region is such that T1<T<T2, the temperature compensation signal TEMP1 is output as an H level signal, while the temperature compensation signal TEMP2 is output as an L level signal. As Vt<V1 and Vt<V2 when the temperature T of the temperature detection region is such that T2<T, the temperature compensation signals TEMP1 and TEMP2 are output as H level signals.

Figure 12:
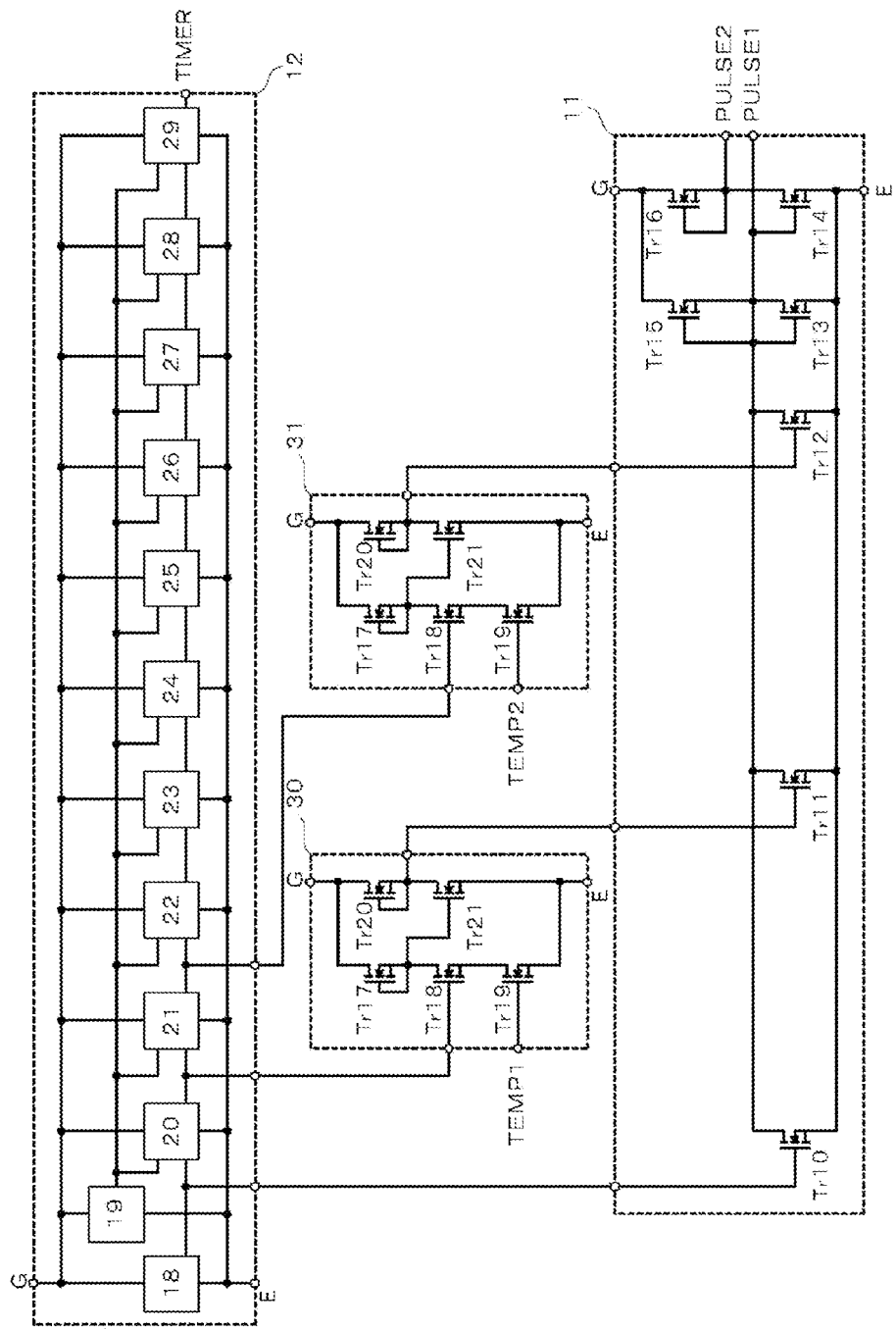
FIG. 12 is a diagram showing circuit configuration examples for the timer circuit, pulse generator circuit, and temperature compensation circuit in accordance with some embodiments of the invention.

The semiconductor device according to the third embodiment of the invention controls the duty using the temperature compensation signals TEMP1 and TEMP2. FIG. 12 shows a circuit configuration for the temperature compensation signals TEMP1 and TEMP2 to control the duty.

As the temperature compensation signals TEMP1 and TEMP2 are output as L level signals when the temperature T of the temperature detection region is such that T<T1, the outputs of AND circuits 30 and 31 are at an L level, and an L level signal is constantly applied to MOSs Tr11 and Tr12. That is, the duty is determined by the oscillator 18.

As the temperature compensation signal TEMP1 is output as an H level signal while the temperature compensation signal TEMP2 is output as an L level signal when the temperature T of the temperature detection region is such that T1<T<T2, the output of the AND circuit 30 is equivalent to the output of the TFF 20, while the output of the AND circuit 31 is at an L level. That is, the duty is determined by the oscillator 18 and TFF 20.

As the temperature compensation signals TEMP1 and TEMP2 are output as H level signals when the temperature T of the temperature detection region is such that T2<T, the output of the AND circuit 30 is equivalent to the output of the TFF 20, while the output of the AND circuit 31 is equivalent to the output of the TFF 21. That is, the duty is determined by the oscillator 18, the TFF 20, and the TFF 21.

The semiconductor device according to the third embodiment of the invention is such that the duty can be varied utilizing the temperature characteristics, and it is thus possible to reduce the temperature dependency of the collector current inclination dIc/dt.

Fourth Embodiment

Figure 13:
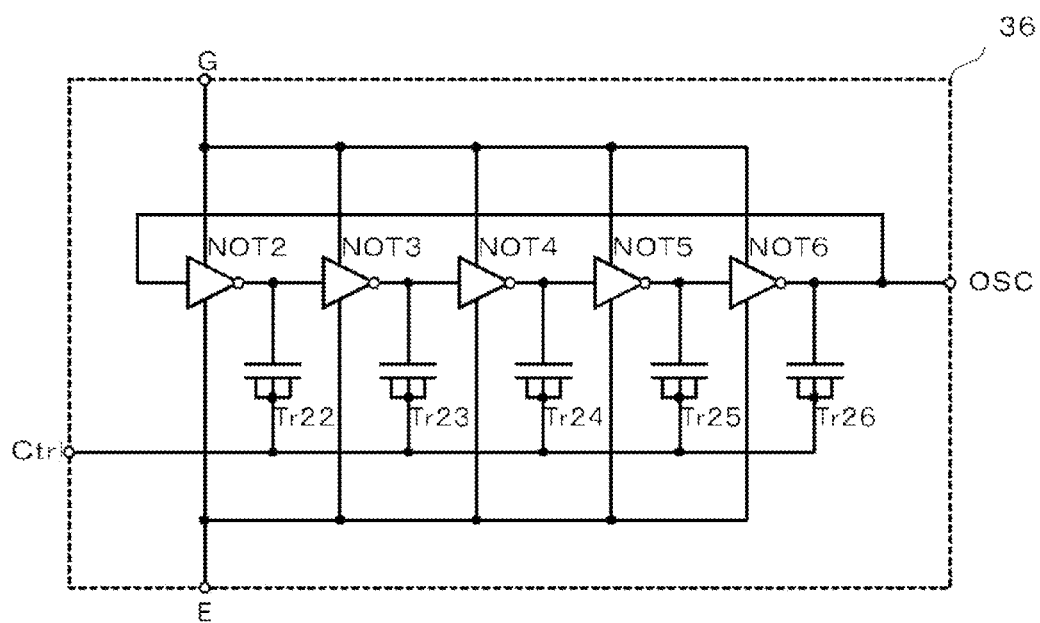
FIG. 13 is a diagram showing a voltage control oscillator in accordance with some embodiments of the invention.

The basic configuration of a semiconductor device according to a fourth embodiment of the invention is the same as that of the second embodiment shown in FIG. 6. The circuit of the fourth embodiment of the invention differs from the second embodiment in that the oscillator 18 in the timer circuit 12 of the second embodiment shown in FIG. 7 is replaced with a voltage control oscillator 36. FIG. 13 shows the voltage control oscillator 36. The voltage control oscillator 36 has a series circuit wherein an inverter NOT3, a MOS Tr22, and a MOS Tr23 are connected in series, a series circuit of an inverted NOT4 connected in parallel to the MOS Tr23 and a MOS Tr24, a series circuit of an inverter NOT5 connected in parallel to the MOS Tr24 and a MOS Tr25, a series circuit of an inverter NOT6 connected in parallel to the MOS Tr25 and a MOS Tr26, and an inverter NOT2 connected in parallel to a series circuit of the inverters NOT3 to NOT6. The MOSs Tr22 to Tr26 are such that the main terminals thereof are short-circuited, and the MOSs Tr22 to Tr26 are used as MOS capacitors. A control voltage input terminal Ctrl of the voltage control oscillator 36 is a connection point at which all the main terminals of the MOSs Tr22 to Tr26 are connected together. The voltage of the capacitor C1 is input into the control voltage input terminal Ctrl by the control voltage input terminal Ctrl being connected to the connection point of the second series circuit. While an output terminal OSC of the voltage control oscillator 36 may be the output terminal of any one of the inverters NOT2 to NOT6, the output of the inverter NOT6 is shown as the output terminal OSC in FIG. 13. The inverters NOT2 to NOT6 are driven by the voltage between the G terminal and E terminal.

An outline description will be given of an operation of the voltage control oscillator 36 shown in FIG. 13. The inverters NOT2 to NOT6 of the voltage control oscillator 36 output a signal to the next stage while inverting the signal. The inverters NOT2 to NOT6 output the inverse signal at a predetermined frequency in accordance with a time constant of the MOSs Tr22 to Tr26 used as MOS capacitors. Herein, assuming the inverter NOT2 to be the first stage, and that an H level signal s input, an inverted L level signal is output. Therefore, an L level signal is output from the inverter NOT6, and the L level signal is input into the inverter NOT2. That is, the outputs of the inverters NOT2 to NOT6 oscillate. As the oscillation frequency of the voltage control oscillator 36 is proportional to the voltage input into the control voltage input terminal Ctrl, the higher the input voltage, the higher the oscillation frequency. Consequently, by replacing the oscillator 18 of FIG. 7 with the voltage control oscillator 36 of FIG. 13, it is possible to vary the pulse cycle and pulse width of the pulse generator circuit 11.

Figure 14:
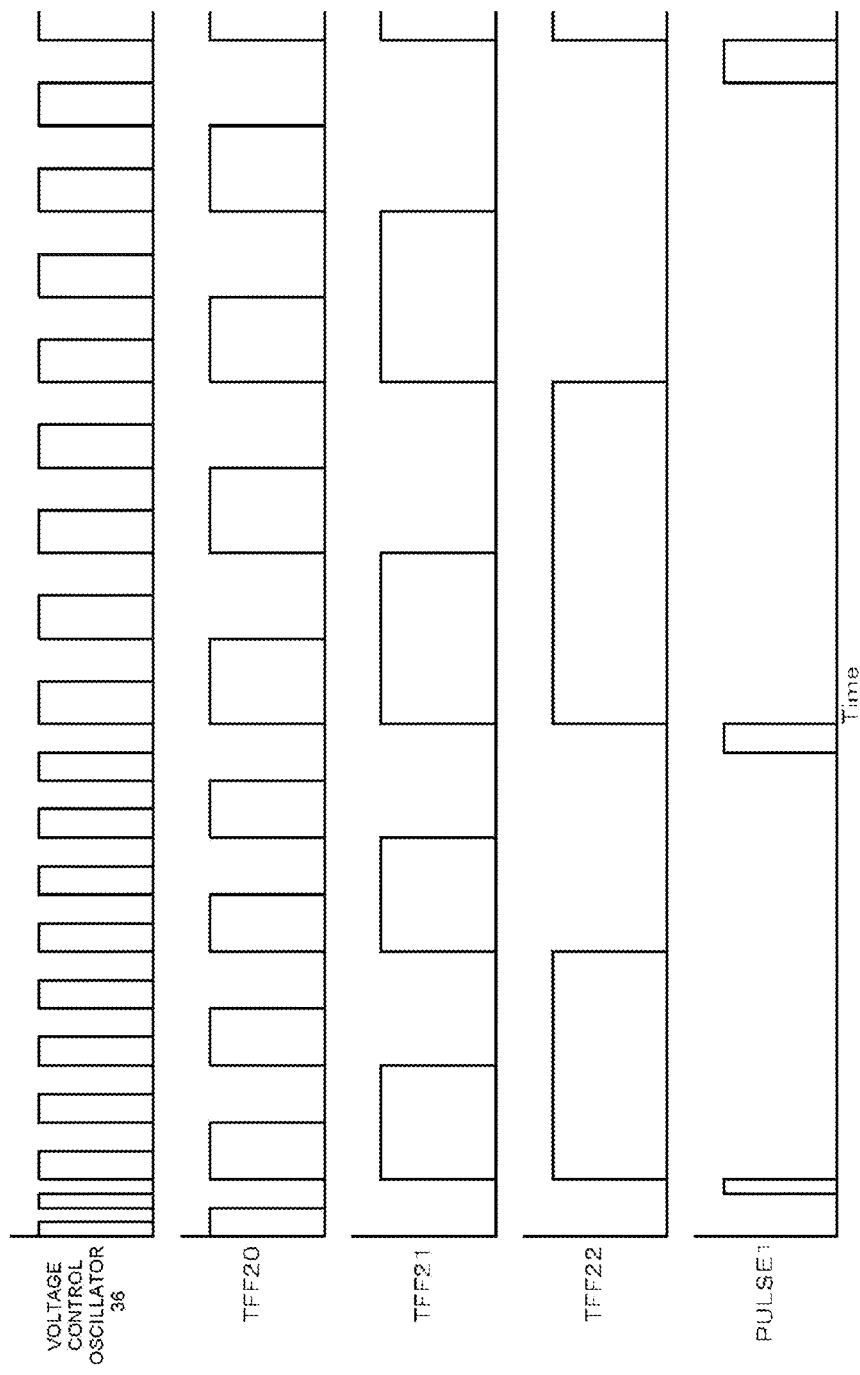
FIG. 14 is a diagram showing time charts for a tinier circuit and pulse generator circuit according to a fourth embodiment of the invention.

FIG. 14 shows time charts of the voltage control oscillator 36, the output signals of the TFFs 20 to 22, and the pulse signal PULSE1. As an outline operation is the same as that of the second embodiment, a description thereof will be omitted, but a difference is that every time the pulse signal PULSE1 is output at an H level, the frequency of the voltage control oscillator 36 decreases. The decrease in frequency is because, when the pulse signal PULSE1 is output at an H level, the MOS Tr5 is turned on, the capacitor C1 is discharged, and the voltage input into the control voltage input terminal Ctrl decreases. in this way, when the voltage of the capacitor C1 is high, it is possible to shorten the cycle of the output pulse of the pulse signal PULSE1, and to reduce the pulse width.

Figure 15:
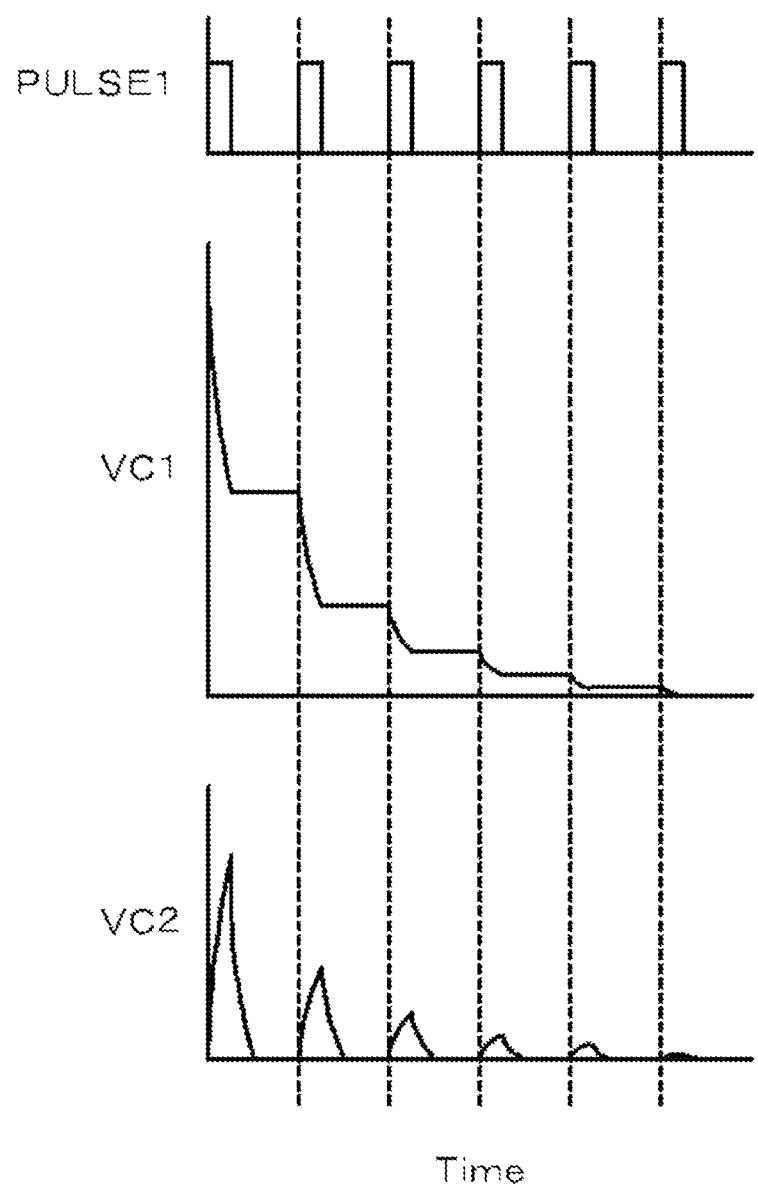
FIG. 15 is a diagram showing detailed operation waveforms of a switched capacitor circuit according to the second embodiment of the invention.
Figure 16:
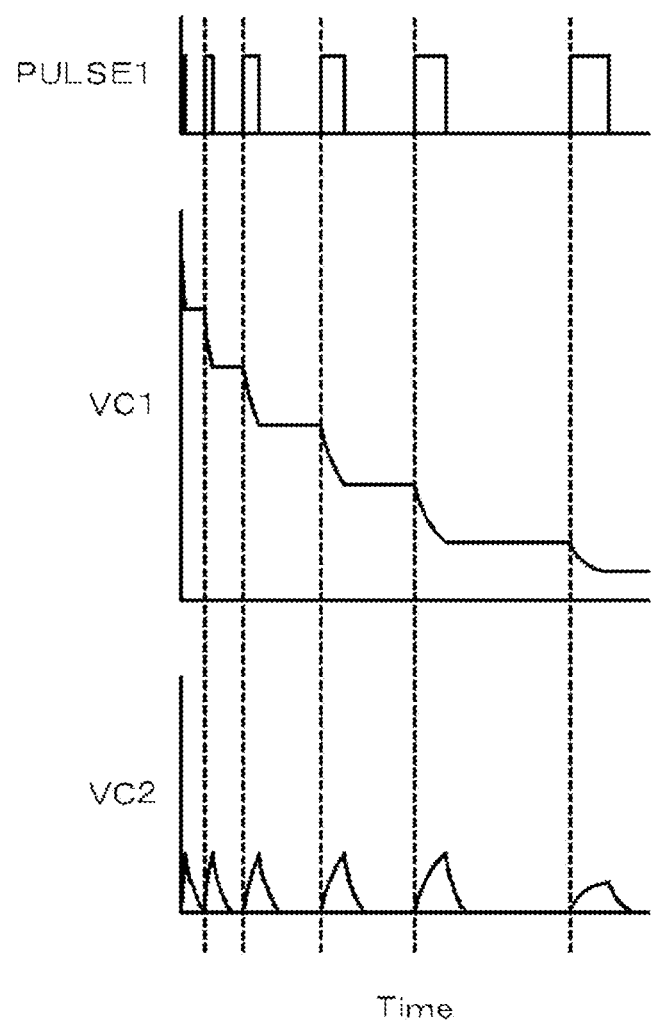
FIG. 16 is a diagram showing detailed operation waveforms of a switched capacitor circuit according to the fourth embodiment of the invention.

Detailed discharge aspects of the pulse signal PULSE1, capacitor C1, and capacitor C2 are shown for the second embodiment in FIG. 15, and for the fourth embodiment in FIG. 16. As shown in these drawings, the duration of the sudden voltage drop when the voltage across the capacitor C1 is high can be reduced, and the voltage range narrowed, further in the fourth embodiment than in the second embodiment. That is, as it is possible to obtain a still gentler change in the current of the IGBT Tr2, it is possible to more reliably prevent erroneous ignition.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2012-095767, filed on Apr. 19, 2012, and Japanese Patent Application No. 2012-209948, filed on Sep. 24, 2012. The disclosures of the priority applications, in their entirety, including the drawings, claims, and the specifications thereof, are incorporated herein by reference.

What is claimed is:

1. A semiconductor device, comprising:
a first series circuit wherein a first semiconductor switching element and a sense resistor are connected in series:
a second semiconductor switching element connected in parallel to the first series circuit;
a drive signal control circuit, into which a drive signal is input, that outputs a drive control signal controlling the first and second semiconductor switching elements; and
a self-interrupting circuit connected to the drive signal control circuit, wherein
the self-interrupting circuit
outputs a predetermined voltage to the drive signal control circuit at a time of normal operation, and
outputs a voltage whose amplitude temporally changes in stages to the drive signal control circuit at a time of abnormal operation,
and the drive signal control circuit
controls so that the amplitude of the drive control signal decreases when the voltage across the sense resistor is higher than the output voltage of the self-interrupting circuit, and
controls so that the amplitude of the drive control signal increases when the voltage across the sense resistor is lower than the output voltage of the self-interrupting circuit.

2. The semiconductor device according to claim 1, the self-interrupting circuit including:
a second series circuit wherein a third semiconductor switching element and a first capacitor are connected in series;
a fourth semiconductor switching element connected in parallel to the first capacitor: and
a third series circuit wherein a fifth semiconductor switching element and a second capacitor are connected in series, wherein
the second series circuit is connected in parallel to the second capacitor, which outputs the voltage across the second series circuit to the drive signal control circuit, and
a voltage of a predetermined value is applied to the third series circuit,
the self-interrupting circuit further including:
an abnormality detecting circuit that supplies the voltage of the predetermined value to the second capacitor by the fifth semiconductor switching element being turned on when it is determined that there is normal operation, and interrupts the voltage supplied to the second capacitor by the fifth semiconductor switching element being turned off when it is determined that there is abnormal operation; and
an interval generator circuit that exclusively turns the third and fourth semiconductor switching elements on and off at a predetermined interval.

3. The semiconductor device according to claim 2, wherein the abnormality detecting circuit determines that there is abnormal operation when the drive signal is input into the drive signal control circuit for a time exceeding a predetermined time.

4. The semiconductor device according to claim 2, wherein the abnormality detecting circuit determines that there is abnormal operation when the temperature of a predetermined region exceeds a predetermined temperature.

5. The semiconductor device according to claim 2, wherein the interval generator circuit controls at least one of the turn-on timing or duty of the third semiconductor switching element.

6. The semiconductor device according to claim 2, wherein the interval generator circuit lengthens the turn-on timing cycle of the third semiconductor switching element further the higher the temperature of a predetermined region.

7. The semiconductor device according to claim 2, wherein the interval generator circuit reduces the duty of the third semiconductor switching element further the higher the voltage of the second capacitor.

* * * * *